US012805063B2

(12) United States Patent
Koestler et al.

(10) Patent No.: US 12,805,063 B2
(45) Date of Patent: Nov. 17, 2026

(54) METHOD FOR THROUGH-HOLE PLATING

(71) Applicant: AZUR SPACE Solar Power GmbH, Heilbronn (DE)

(72) Inventors: Wolfgang Koestler, Heilbronn (DE); Tim Kubera, Leingarten (DE)

(73) Assignee: Azur Space Solar Power GmbH, Heilbronn (DE)

( * ) Notice: Subject to any disclaimer, the term of this patent is extended or adjusted under 35 U.S.C. 154(b) by 898 days.

(21) Appl. No.: 17/685,074

(22) Filed: Mar. 2, 2022

(65) Prior Publication Data

US 2022/0285567 A1 Sep. 8, 2022

(30) Foreign Application Priority Data

Mar. 2, 2021 (DE) ..................... 10 2021 001 116.3

(51) Int. Cl.
*H10F 77/00* (2025.01)
*B41M 3/00* (2006.01)
*H10F 71/00* (2025.01)

(52) U.S. Cl.
CPC ........... *H10F 77/935* (2025.01); *B41M 3/006* (2013.01); *H10F 71/1212* (2025.01)

(58) Field of Classification Search
CPC ........... H01L 31/02008; H01L 31/1808; H01L 31/184; H01L 31/1852; H01L 31/02245; H01L 31/1876; H01L 31/02167; H01L 31/0443; H01L 31/0516; H01L 31/1804; B41M 3/006; H10F 77/935; H10F 71/1212; H10F 71/127; H10F 71/1276;
(Continued)

(56) References Cited

U.S. PATENT DOCUMENTS 5,425,816 A * 6/1995 Cavicchi ......... H01L 31/022425 136/262
9,087,940 B2 7/2015 Thaidigsmann et al.
(Continued)

FOREIGN PATENT DOCUMENTS

CN 102859709 A 1/2013
CN 103003951 A 3/2013
(Continued)

OTHER PUBLICATIONS

Mathieu de Lafontaine et al: "III-V/Ge Multijunction Solar Cell with Through Cell via Contacts Fabrication" Oct. 23, 2018.

*Primary Examiner* — Mohammad M Hoque
(74) *Attorney, Agent, or Firm* — Muncy, Geissler, Olds & Lowe, P.C.

(57) ABSTRACT

A method for plating by means of a through-hole on a semiconductor wafer at least comprising the steps: providing a semiconductor wafer having a top side and a bottom side, wherein the semiconductor wafer has a plurality of solar cell stacks and comprises a substrate on the bottom side, and each solar cell stack has at least two III-V subcells, disposed on the substrate, and at least one through-hole, extending from the top side to the bottom side of the semiconductor wafer, with a continuous side wall, wherein the through-hole has a first edge region on the top side and a second edge region on the bottom side; applying an insulating layer to part of the first edge region, the side wall, and to the second edge region by means of a first printing process; and applying an electrically conductive layer.

25 Claims, 2 Drawing Sheets

(58) Field of Classification Search
CPC ...... H10F 77/223; H10F 19/75; H10F 19/908; H10F 71/121; H10F 77/311; H10F 71/137
USPC ........................................................ 438/98
See application file for complete search history.

(56) References Cited

U.S. PATENT DOCUMENTS

| | | | | |
|---|---|---|---|---|
| 9,680,035 | B1 | 6/2017 | Chary et al. | |
| 10,784,381 | B2 | 9/2020 | Dudek | |
| 2001/0054436 | A1* | 12/2001 | Mukai | H10F 10/17 136/251 |
| 2009/0139570 | A1* | 6/2009 | Kinoshita | H10F 10/166 136/258 |
| 2011/0041890 | A1 | 2/2011 | Sheats | |
| 2011/0120548 | A1* | 5/2011 | Chen | H01L 31/02245 257/E31.124 |
| 2011/0129999 | A1* | 6/2011 | Nukaga | H10W 20/023 257/E21.477 |
| 2011/0253211 | A1* | 10/2011 | Krokoszinski | H10F 10/14 257/E31.124 |
| 2012/0133049 | A1* | 5/2012 | Lin | H10W 20/023 257/E21.586 |
| 2013/0008501 | A1 | 1/2013 | Guillevin et al. | |
| 2013/0125976 | A1* | 5/2013 | Romijn | H01L 31/0682 438/98 |
| 2015/0206997 | A1* | 7/2015 | Fidaner | H10F 10/142 136/255 |
| 2015/0243804 | A1 | 8/2015 | Thaidigsmann et al. | |
| 2017/0345955 | A1* | 11/2017 | Chary | H10F 77/935 |
| 2020/0083273 | A1* | 3/2020 | Shigetoshi | H10D 84/0126 |
| 2021/0066516 | A1 | 3/2021 | Kubera et al. | |
| 2021/0273124 | A1* | 9/2021 | Zhang | H10F 10/161 |

FOREIGN PATENT DOCUMENTS

| | | | |
|---|---|---|---|
| CN | 203760491 | U | 8/2014 |
| CN | 104685638 | A | 6/2015 |
| CN | 209056507 | U | 7/2019 |
| CN | 110364565 | A | 10/2019 |
| DE | 69216502 | T2 | 4/1997 |
| EP | 0528311 | A2 | 2/1993 |
| EP | 3787046 | A1 | 3/2021 |
| WO | WO2013172632 | A1 | 11/2013 |

* cited by examiner

METHOD FOR THROUGH-HOLE PLATING

This nonprovisional application claims priority under 35 U.S.C. § 119(a) to German Patent Application No. 10 2021 001 116.3, which was filed in Germany on Mar. 2, 2021, and which is herein incorporated by reference.

BACKGROUND OF THE INVENTION

Field of the Invention

The present invention relates to a method for through-hole plating.

Description of the Background Art

In order to reduce the shading of the front side of a solar cell, it is possible to arrange both the positive and the negative external contact surface on the back side. In the case of so-called metal wrap through (MWT) solar cells, the solar cell front side is contacted from the back side, for example, by a through-contact hole.

Different methods are known for producing a hole or a through-contact hole through a solar cell. The metallization running through the through-hole is insulated from the solar cell stack layers by means of an insulating layer.

For example, a solar cell stack consisting of multiple III-V subcells on a GaAs substrate with a back-contacted front side is known from U.S. Pat. No. 9,680,035 B1, wherein a hole reaching from the top side of the solar cell through the subcells into a substrate layer that has not yet been thinned is produced by means of a wet-chemical etching process. The etching process is based on the fact that the etch rates do not differ significantly, at least for the employed different III-V materials of the solar cell stack. Passivation and metallization of the front side and the hole are carried out before the substrate layer is thinned.

SUMMARY OF THE INVENTION

It is therefore an object of the present invention to provide a device that advances the state of the art.

According to an exemplary embodiment of the invention, a method for the through-hole plating of a semiconductor wafer is provided, wherein the method comprises multiple steps.

In a first process step, a semiconductor wafer having a top side and a bottom side is provided, wherein the semiconductor wafer has a plurality of solar cell stacks and comprises a substrate on the bottom side.

Each solar cell stack has at least two III-V subcells, disposed on the substrate, and at least one through-hole, extending from the top side to the bottom side of the semiconductor wafer, with a continuous side wall. The through-hole has a first edge region on the top side and a second edge region on the bottom side.

In a second process step, an insulating layer is applied to part of the first edge region, the side wall, and to the second edge region by means of a first printing process.

In a third process step, an electrically conductive layer is applied by means of a second printing process to the insulating layer on the top side and part of the first edge region, to the insulating layer on the side wall, and to part of the insulating layer on the bottom side.

It is understood that the process steps may be carried out in the order mentioned.

It should be noted that the term "insulating layer" is also understood to mean, for example, a dielectric layer system comprising the insulating layer. Furthermore, the term edge region is used to refer to a region, located directly at the through-hole, on the top side and on the bottom side.

It should be noted that there is an irradiation with light on the top side. In order to shade as little as possible from the top side, the top side is electrically connected by means of a metallic finger structure.

The band gap can decrease from the top side in the direction of the substrate from subcell to subcell. In general, the subcells of the particular solar cell stack exhibit an n on p arrangement. It is understood that a tunnel diode is formed between each two subcells in order to connect the individual subcells in series from an electrical point of view. In particular, the uppermost subcell comprises an InGaP compound and has a band gap greater than 1.7 eV.

It is understood that a generally finger-shaped top side metallization can be disposed on the top side so as to electrically connect the front side. In the following, the top side metallization may also be referred to as the metal structure.

It should be noted that the through-hole can be formed oval in shape. In the present case, the term "oval" also comprises round, in particular circular, ovoid, and elliptical shapes. The through-hole can also be formed as a quadrangular shape with rounded corners. It is understood that for each solar cell stack, the front side is electrically connected from the back side by means of one or more through-holes.

Preferably, prior to forming the through-hole, the semiconductor wafer, which generally has a diameter of 100 mm or 150 mm, is thinned to the desired final thickness. For this purpose, substrate material is removed on the back side.

It should be noted, furthermore, that the semiconductor wafer has a plurality of non-separated solar cell stacks, wherein the substrate forms the bottom side of the semiconductor wafer. It is understood that the solar cell stack also has 3 or 4 or 5 or a maximum of 6 subcells.

An advantage of the method is that photolithographic process steps are avoided by means of the multiple structured application by means of a printing process, i.e., of the insulating layer as well as of the metal layer. In particular, the associated process uncertainties are avoided when applying a coating layer in the case of a large topography. The formation of the through-hole plating, i.e., the formation of an electrical connection of the front side from the back side, simplifies the electrical connection of the solar cell stack, and reliable protection of the insulating layer is formed in the area of the through-hole.

In particular, the time and technical effort as well as the material consumption are low compared to the prior art. A further advantage is that reliability and yield are increased.

Stated differently, the through-hole and the areas adjacent to the through-hole are covered on the top side and on the bottom side exclusively by means of the printing process. Highly efficient and reliable multi-junction solar cells, the front side of which is electrically connected to the back side, can be produced with the method in a simple and cost-effective manner.

A first baking step can be carried out after the first printing process and before the second printing process. In another refinement, a second baking step is performed after the second printing process. The insulating layer and the conductive layer are each conditioned by means of the baking steps. The baking steps are preferably carried out within a temperature range between 100° C. and 450° C.

A paste can be used to form the insulating layer. Preferably, the paste comprises organic components.

A paste containing metal particles can be used to form the conductive layer.

The first printing process and/or the second printing process can be carried out exclusively from the front side or exclusively from the back side. Alternatively, the first printing process and/or the second printing process are carried out both from the front side and from the back side.

The through-hole still can have a continuous hole after the insulating layer is formed. Alternatively, the through-hole is opened in a central area by means of a laser.

After the conductive layer is formed, the through-hole can be partially or completely closed. Alternatively, the through-hole still has a continuous hole after the conductive layer is formed.

The conductive layer on the first edge region and in the through-hole and on the second edge region can be made of the same material. In an alternative embodiment, different compositions are used to form the conductive layer on the top side and on the bottom side.

Provided that the through-hole is completely closed by means of the conductive layer, the conductive layer can protrude beyond the top side and/or at the bottom side. Alternatively, the conductive layer on the bottom side on the insulating layer forms a planar surface in a first approximation with the conductive layer in the center of the through-hole.

The first edge region on the top side can have a different, in particular smaller, diameter than the second edge region on the bottom side.

The first edge region and the second edge region can each be formed as an edge region completely surrounding the through-hole. Preferably, the respective edge region parallel to the semiconductor wafer has a diameter of at least 10 μm and at most 3.0 mm. Alternatively, the respective edge region parallel to the semiconductor wafer has a diameter of at least 100 μm and at most 1.0 mm.

The printing process can be carried out by means of an inkjet process or a screen printing process or by means of a dispensing process. Alternatively, the printing process is carried out by means of a stencil printing process. In another refinement, at least two of the different printing methods are combined.

The through-hole of the semiconductor wafer can have a total height of at most 500 μm and of at least 30 μm or of at most 200 μm and of at least 50 μm.

The through-hole can have a circumference which is oval in cross section, in particular a round circumference. Preferably, the through-hole has a diameter between 25 μm and 1 mm prior to the use of the first printing process. Alternatively, the diameter is in a range between 50 μm to 300 μm.

The diameter of the through-hole prior to the use of the first printing process in the substrate from the direction of the top side toward the bottom side is in a first approximation or exactly the same. Alternatively, the diameter of the through-hole becomes smaller from the top side in the direction toward the bottom side, wherein the taper is preferably formed in steps. In one refinement, the through-hole has an hourglass-shaped profile in a cross section. Here, the cross section tapers to about half of the total thickness.

The taper can comprise exactly one step in the through-hole or exactly two fully circumferential steps.

The substrate can be formed as electrically conductive. Preferably, the substrate comprises germanium or GaAs or silicon or consists of one of the aforementioned materials. Alternatively, the substrate comprises a metal film or comprises an electrically conductive plastic.

Preferably, the semiconductor wafer or the substrate can have a size of 100 mm or 150 mm or larger.

If the substrate comprises or consists of germanium, the Ge substrate forms the bottom side of the semiconductor wafer. Preferably, a first subcell is formed as a Ge subcell in the Ge substrate on the side facing away from the bottom side, wherein the Ge subcell has the smallest band gap of the subcells of the solar cell stack.

When Ge is used as the substrate, a first step is formed at the interface between the Ge subcell and the overlying III-V subcells. A second step is preferably formed between the Ge subcell and the Ge substrate.

The through-hole can also taper within the Ge substrate. The step-shaped or conical design of the through-hole has the advantage that the thickness of the layers can be sufficiently formed on the side surfaces, in particular in the case of a preferably conformal deposition of the insulating layer and/or other layers to be applied as part of a metallization.

A further step can be formed on the top side of the semiconductor wafer at the interface between the metal structure and the top side of the uppermost III-V subcell.

The solar cell stack can have a Ge subcell. As a result, the solar cell stack comprises at least 3 subcells.

Part of the insulating layer on the top side can be formed on a metal surface. This makes it possible to ensure that the metal structure, i.e., the front side of the solar cell stack, is connected on the top side.

Stated differently, because the conductive layer on the top side overlaps the insulating layer and forms a material connection with part of the metal structure and on the bottom side, however, covers only the part of the second edge region that is immediately adjacent to the through-hole, a contact region for an electrical connection of the metal structure MV is thereby formed on the bottom side.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

Figure 3:
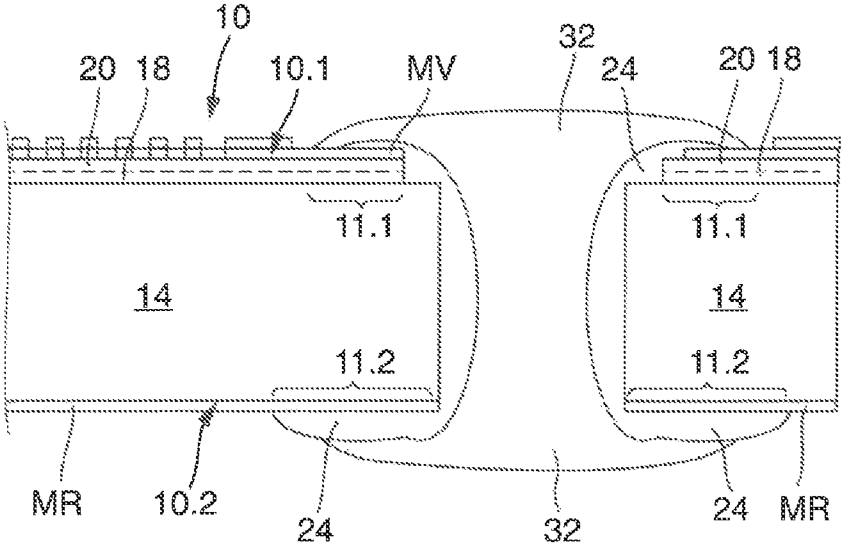
FIG. 3 shows a cross-sectional view of a metallized through-hole in another embodiment.
Figure 5:
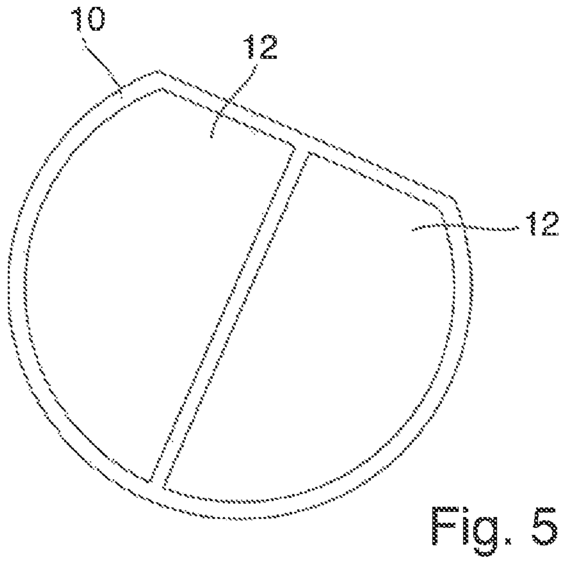

FIG. **4*a* shows a top view of the top side of the metallized through-hole according to the embodiment shown in connection with the diagram in FIG. 3**;

FIG. **4*b* shows a top view of the bottom side of the metallized through-hole according to the embodiment shown in connection with the diagram in FIG. 3**;

FIG. 5 shows a top view of a semiconductor wafer with two solar cell stacks.

DETAILED DESCRIPTION

Figure 1:
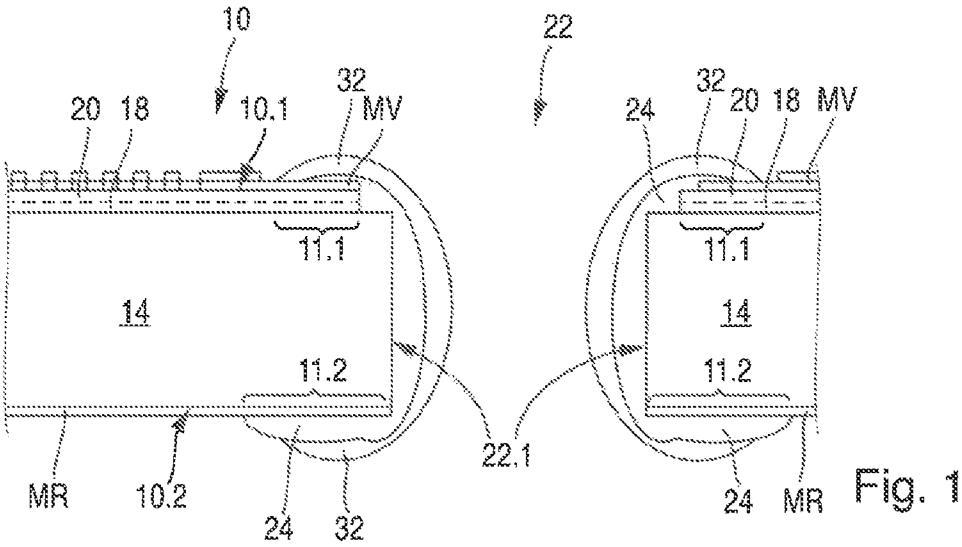
FIG. 1 shows a cross-sectional view of a metallized through-hole in an exemplary embodiment.

The diagrams in FIG. 1 show a cross-sectional view of a metallized through-hole 22 of a semiconductor wafer 10.

A semiconductor wafer 10 is provided having a top side 10.1, a bottom side 10.2, and a through-hole 22, which extends from top side 10.1 to bottom side 10.2, with a continuous side wall 22.1.

Semiconductor wafer 10 comprises multiple not yet separated solar cell stacks 12; in the present case, only one solar cell stack 12 is shown, in each case with a layer sequence of a substrate 14 forming bottom side 10.2, a first III-V subcell 18, and a second III-V subcell 20 forming top side 10.1.

A metal structure MV is formed on top side 10.1. The metal structure MV is formed almost exclusively as a finger-shaped structure and, in particular, in first edge region 11.1 of through-hole 22, has a continuous metal surface formed completely around through-hole 22.

A full-area backside metallization MR is formed on bottom side 10.2 so as to connect conductive substrate 14. It is understood that the particular solar cell stack 12 is electrically connected to the two metallizations MV and MR.

Through-hole 22 has a first edge region 11.1 on top side 10.1 and a second edge region 11.2 on bottom side 10.2. First edge region 11.1 is formed directly on the metal structure MV and second edge region 11.2 is formed directly on the backside metallization MR.

A part of first edge region 11.1 that is formed directly around through-hole 22, and the entire second edge region 11.2 and side wall 22.1 of through-hole 22 are coated with an insulating layer 24, wherein insulating layer 24 is formed using a first printing process. It is understood that side wall 22.1 in through-hole 22 is completely covered by insulating layer 24.

By means of a second printing process, a conductive layer 32 is applied to the entire area of first edge region 11.1 and completely to the entire area of side wall 22.1 and to a part of second edge region 11.2 that is immediately adjacent to through-hole 22. In the present case, through-hole 22 is still open even after conductive layer 32 has been formed.

Because conductive layer 32 on top side 10.1 overlaps insulating layer 24 and forms a material connection with part of the metal structure MV and on bottom side 10.2, however, covers only the part of second edge region 11.2 that is immediately adjacent to through-hole 22, a contact region for a connection of the metal structure MV is thereby formed on bottom side 10.2.

Figure 2:
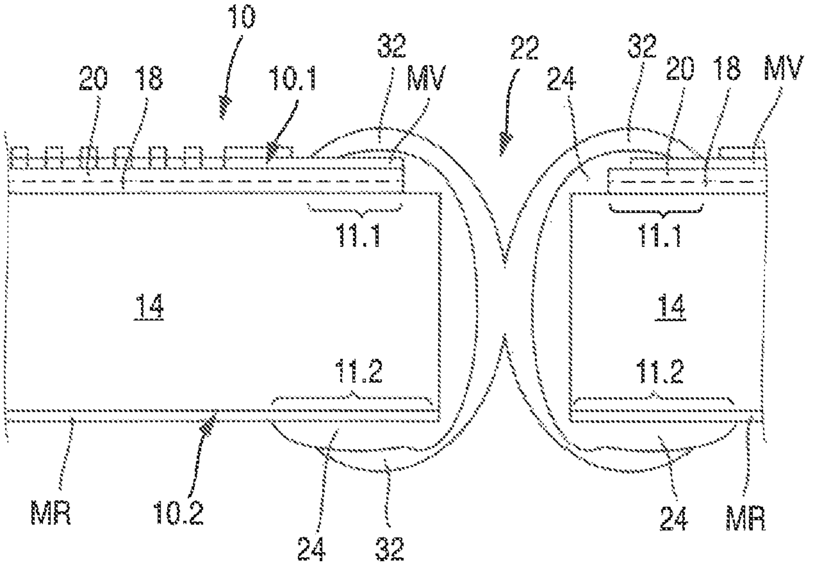
FIG. 2 shows a cross-sectional view of a metallized through-hole in a further embodiment.

A further embodiment is shown in the diagram in FIG. 2. Only the differences from the diagram in FIG. 1 will be explained below.

In the embodiment shown, conductive layer 32 joins in the center of substrate 14 and forms an hourglass-shaped profile.

Another embodiment is shown in the diagram in FIG. 3. Only the differences from the diagram in FIG. 1 will be explained below.

In the embodiment shown, through-hole 22 is completely filled by conductive layer 32 and forms an elevation protruding from top side 10.1 and an elevation protruding from bottom side 10.2.

Figure 4A:
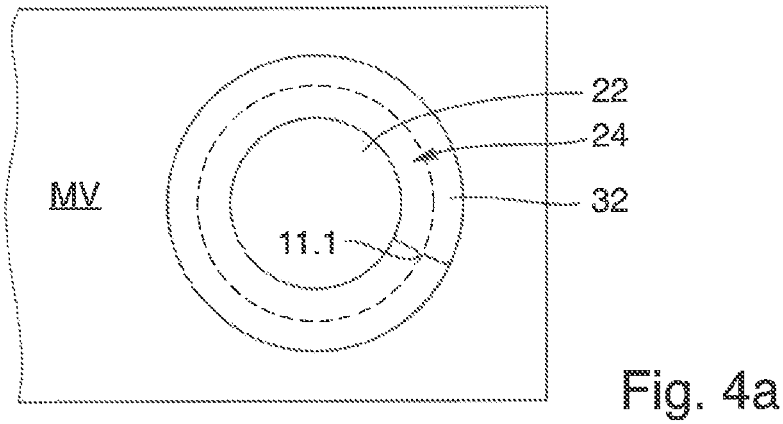

The diagram in FIG. 4*a* shows a top view of the top side of the metallized through-hole 22 according to the embodiment shown in connection with the diagram in FIG. 3.

First edge region 11.1, as part of the metal structure MV, completely encloses through-hole 22. The part of first edge region 11.1 covered with insulating layer 24 is shown dashed. It can be seen that conductive layer 22 completely covers insulating layer 24 on top side 10.1.

Figure 4B:
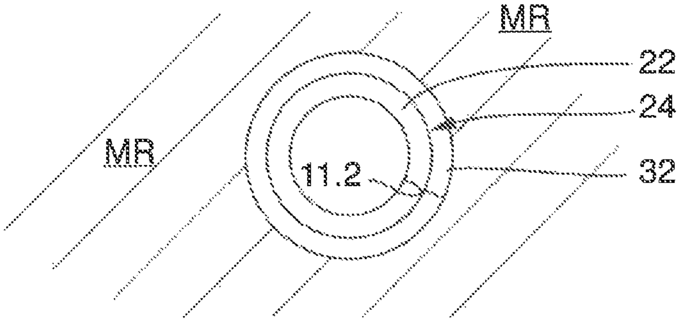

The diagram in FIG. 4*b* shows a top view of the bottom side of the metallized through-hole 22 according to the embodiment shown in connection with the diagram in FIG. 3.

Second edge region 11.2, as part of the backside metallization MR, completely encloses through-hole 22. The part of second edge region 11.2 that is covered with insulating layer 24 is now larger than the part covered with conductive layer 22. Stated differently, conductive layer 22 only partially covers insulating layer 24 on bottom side 10.2.

A plan view of a semiconductor wafer 10 having two solar cell stacks is shown in the diagram in FIG. 5. In the present case, semiconductor wafer 10 has exactly two solar cell stacks 12. It is understood that in embodiments not shown, more than two solar cell stacks 12 are also formed on semiconductor wafer 10.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for plating via a through-hole in a semiconductor wafer, the method comprising:

providing the semiconductor wafer having a top side and a bottom side, the semiconductor wafer having a plurality of solar cell stacks on the top side and comprises a substrate on the bottom side;

providing a metal structure on the top side for connecting the plurality of solar stacks;

providing each of the plurality of solar cell stacks with at least two III-V subcells disposed on the substrate; and providing at least one open through-hole extending completely through the semiconductor wafer from the top side to the bottom side of the semiconductor wafer and having a continuous side wall, wherein the at least one open through-hole has a first edge region on the top side and a second edge region on the bottom side, wherein the metal structure is formed directly on the first edge region;

subsequently applying an insulating layer to a part of the first edge region, the continuous side wall, and to the second edge region via a first printing process, wherein a part of the metal structure is covered by the insulating layer, wherein the open through-hole remains open after said applying the insulating layer; and thereafter applying an electrically conductive layer via a second printing process to the insulating layer on the top side, wherein the conductive layer overlaps the insulating layer on the top side and is printed to the metal structure and forms a material connection with a part of the metal structure, and the part of the first edge region, to the insulating layer on the side wall, and to a part of the insulating layer on the bottom side, wherein the at least one open through-hole is provided prior to said applying the insulating layer by the first printing process.

2. The method according to claim 1, wherein a paste is used to form the insulating layer and the paste comprises organic components.

3. The method according to claim 1, wherein a paste containing metal particles is used to form the conductive layer.

4. The method according to claim 1, wherein the first printing process and/or the second printing process are carried out exclusively from the front side or exclusively from the back side.

5. The method according to claim 1, wherein after the insulating layer is formed, the through-hole still has a continuous hole.

6. The method according to claim 1, wherein after the conductive layer is formed, the through-hole is partially or completely closed or the through-hole still has a continuous hole.

7. The method according to claim 1, wherein the first edge region has a different, diameter than the second edge region.

8. The method according to claim 1, wherein the first edge region and the second edge region are each formed as an edge region completely surrounding the through-hole, and wherein the respective edge region parallel to the semiconductor wafer has a diameter of at least 10 μm and at most 3.0 mm.

9. The method according to claim 1, wherein the first printing process is carried out via an inkjet process or a screen printing process or a dispensing process or a stencil printing process.

10. The method according to claim 1, wherein the through-hole of the semiconductor wafer has a total height of at most 500 μm and of at least 30 μm.

11. The method according to claim 1, wherein the through-hole of the semiconductor wafer has a circumference which is oval in cross section, in particular a round circumference.

12. The method according to claim 1, wherein the through-hole has a diameter between 25 μm and 1 mm.

13. The method according to claim 1, wherein the diameter of the through-hole in the substrate from the top side in the direction toward the bottom side is in a first approximation or exactly the same.

14. The method according to claim 1, wherein the substrate is formed as electrically conductive and the substrate comprises germanium or GaAs or silicon or consists of one of the aforementioned materials or the substrate comprises or consists of a metal film or an electrically conductive plastic.

15. The method according to claim 1, wherein the solar cell stack has a Ge subcell.

16. The method according to claim 1, wherein part of the insulating layer on the top side is formed on a metal surface.

17. The method according to claim 1, wherein the first edge region and the second edge region are each formed as an edge region completely surrounding the through-hole, and wherein respective edge region parallel to the semiconductor wafer has a diameter of at least 100 μm and at most 1.0 mm.

18. The method according to claim 1, wherein the through-hole of the semiconductor wafer has a total height of at most 200 μm and of at least 50 μm.

19. The method according to claim 1, wherein the through-hole has a diameter between 50 μm to 300 μm prior to the use of the first printing process.

20. The method according to claim 1, wherein the metal structure is on the at least two III-V subcells.

21. The method according to claim 1, wherein the electrically conductive layer covers an entirety of the first edge region and less than an entirety of the second edge region.

22. The method according to claim 1, wherein the at least one through-hole is tapered.

23. The method according to claim 1, wherein the at least one through-hole is step-shaped or conical.

24. The method according to claim 1, wherein the first edge region has a different diameter than the second edge region.

25. The method according to claim 1, wherein the through hole has a top opening at the top side and a bottom opening at the bottom side.

* * * * *